United States Patent [19]

Jordan et al.

[11] 4,104,420

[45] Aug. 1, 1978

[54] PHOTOVOLTAIC CELL

[75] Inventors: John F. Jordan, El Paso, Tex.; Curtis Lampkin, Cincinnati, Ohio

[73] Assignee: Photon Power, Inc., El Paso, Tex.

[21] Appl. No.: 767,684

[22] Filed: Feb. 11, 1977

Related U.S. Application Data

[60] Continuation of Ser. No. 607,233, Aug. 25, 1975, abandoned, which is a division of Ser. No. 476,062, Jun. 3, 1974, abandoned, which is a division of Ser. No. 303,365, Nov. 3, 1972, Pat. No. 3,902,920.

[51] Int. Cl.$^2$ .......................... B05D 5/12; H01M 2/00
[52] U.S. Cl. .................................... 427/74; 427/123;
427/261; 427/372 R; 427/383 A; 427/383 D;
427/421; 136/89 CD; 136/89 TF; 148/188;
29/572; 357/16; 357/59
[58] Field of Search ................. 427/74, 123, 421, 227;
136/89 CD, 89 TF; 357/16, 59; 29/572;
148/188, 261, 372 R, 383 A, 383 D

[56] References Cited

U.S. PATENT DOCUMENTS

| | | | |
|---|---|---|---|
| 2,522,531 | 9/1950 | Mochel | 427/109 |
| 3,148,084 | 9/1964 | Hill et al. | 427/74 |
| 3,192,067 | 6/1965 | Jordan et al. | 427/53 |
| 3,411,050 | 11/1968 | Middleton et al. | 427/74 |
| 3,416,956 | 12/1968 | Keramidas et al. | 136/89 CD |
| 3,530,053 | 9/1970 | Scott et al. | 427/53 |
| 3,880,633 | 4/1975 | Jordan et al. | 427/74 |
| 3,902,920 | 9/1975 | Jordan et al. | 136/89 CD |
| 3,959,565 | 5/1976 | Jordan et al. | 427/427 |

*Primary Examiner*—Michael F. Esposito
*Attorney, Agent, or Firm*—Bard, Springs, Jackson & Groves

[57] ABSTRACT

A large area photovoltaic cell comprising a layer of multicrystalline cadmium sulfide, about 1 to 2 microns thick, formed by simultaneously spraying two suitably selected compounds on a uniformly heated plate of Nesa glass, thereafter forming a coating of $Cu_2S$ over the cadmium sulfide layer while the latter is heated, to form a photovoltaic heterojunction, applying thereover a layer of $CuSO_4$, and applying electrodes of Cu and Zn, respectively, to separated areas of the layer of $CuSO_4$, and heating the cell to form a cuprous oxide rectifying junction under the copper electrode by reaction of the Cu electrode with the $CuSO_4$, while diffusing the zinc through the body of the cell. The diffusion of the zinc provides a negative electrode coplanar with the positive copper electrode, eliminating any need for introducing mechanically complex provision for making a connection to the Nesa glass, while the use of a $CuSO_4$—Cu combination enables use of a layer of CdS only 1 to 2 microns thick, rather than the usual 20 microns, despite the fact that such thin layers tend to have pinholes, which in the prior art render the cells inoperative, but in the present teaching do not.

14 Claims, 4 Drawing Figures

PHOTOVOLTAIC CELL

This is a continuation of application Ser. No. 607,233, which was filed Aug. 25, 1975, and which was abandoned as of the filing date of this application. Application Ser. No. 607,233 was a division of application Ser. No. 476,062, filed June 3, 1974, now abandoned, which in turn was a division of application Ser. No. 303,365, filed Nov. 3, 1972, which is now U.S. Pat. No. 3,902,920, issued Sept. 2, 1975.

BACKGROUND OF THE INVENTION

In the art of making micro-crystal cadmium sulfide voltaic cells it has been the practice to fabricate the cadmium sulfide layer of considerable thickness, say 20 microns. This has been deemed necessary to assure that pin holes, or other types of defects, do not occur in the layer which, if present, render the cell inoperative. It has heretofore been considered unfeasible to utilize extremely thin layers of cadmium sulfide because a large proportion of the cells prove defective in practice. It is one purpose of the present invention to provide a large area photo-voltaic cell capable of being incorporated in a system employing areas of photovoltaic generators covering areas of the order of square miles, to enable large scale production of electric power. In such systems the total quantity of cadmium required becomes a problem, since cadmium is in short supply in the United States and is expensive. Reduction of the feasible thickness of cadmium compound required to fabricate a given area of cell is therefore crucial economically, and a reduction of thickness of CdS layer by an order of magnitude or more renders economically feasible a large scale power generator of the photo-voltaic type, which otherwise is not economically feasible. Utilization of minimum cadmium per unit area of cell is rendered feasible by utilization of a $CuSO_4$—Cu combination in the cell.

It is, accordingly, a primary object of the present invention to provide a photovoltaic cell which utilizes minimum weight of cadmium per unit area and which can therefore be economically utilized as a power source in a large scale electrical power generation system. This same objective is subserved by providing a cell which has only coplanar electrodes, and also in terms of time required to fabricate a given area of cell, a twenty micron layer requiring twenty times as much spray time as does a one micron layer, in forming the requisite cadmium sulfide microcrystalline layer on a substrate.

In the U.S. Patent to Hill et al. U.S. Pat. No. 3,148,084, issued Sept. 8, 1964, a method is taught for forming a layer of cadmium sulphide microcrystals on a glass substrate. Essentially, the method involves spraying the glass substrate, while the layer is hot, with a cadmium salt-thiourea complex, i.e., cadmium chloride plus a thiourea, in suitable proportions. The teaching of the patent is that the glass may be heated by means of a hot plate, and that the spraying may take place in the atmosphere. We have found that precisely uniform temperature of the glass plate is essential and that a hot plate is not able to heat a glass plate uniformly because the hot plate and the glass plate do not make prefect contact throughout, and that even slight nonuniformities of temperature of the glass substrate during spraying produce anomalous areas of the layer of CdS, which can render an entire photovoltaic cell inoperative.

The layer of CdS must grow in the form of many tiny crystals, the axes of which are predominantly parallel. Application of the sprayed materials at a uniform, and sufficiently slow rate, is important, as is uniformity of temperature, to assure uniformity of crystal growth rate and of orientation over the entire glass plate.

In order to provide uniformity of temperature over the entire glass plate, according to one feature of the invention, the plate is floated during coating in melted tin, at over 700° F.

In accordance with the teaching of U.S. patent to A. E. Carlson, U.S. Pat. 2,820,841, issued Jan. 21, 1958, it is necessary to superimpose $Cu_2S$ to form a heterojunction on a layer of CdS micro-crystals formed on Nesa glass. This may be accomplished according to the present invention by spraying on the layer of CdS while the latter is at about 200° F. to 300° F., a small quantity of copper chloride and of thiourea, which, in impinging against the hot CdS, forms a layer of $Cu_2S$ about 1000 A° thick thereover. Since the layer of $Cu_2S$ is formed by spraying cold materials which form only on contact with the CdS layer, a flat layer is formed which so combines with the exposed parts of the CdS crystals as to form the required photovoltaic junction.

At this point, according to the teaching of Carlson, supra, it would appear only necessary to apply an electrode to the $Cu_2S$ layer, and a lead to the Nesa glass, to complete the fabrication of a photovoltaic cell. A cell so fabricated is not satisfactory. Nesa glass is conductive only because it has a coating of tin oxide. But, tin oxide has high resistance taken along the surface of the glass, so that a great deal of the energy generated by the cell is lost in the tin oxide layer, and this is the more true the larger is the cell. The problem can be ameliorated by breaking up larger cells into smaller cells, as in FIG. 4 of Carlson et al, but only at the cost of added complexity of fabrication.

According to the present invention, we deposit over the layer of $Cu_2S$ a layer of $CuSO_4$, by spraying, and over the latter deposit two separated electrodes of copper and zinc, respectively. On heating the cell to about 500° F. for about 12 minutes, the $CuSO_4$ gives up oxygen to the copper electrode, forming a CuO rectifying like junction, which is conductive for current flow out of the copper electrode, but the zinc diffuses down through the layers which it overlies, sometimes down to the layer of tin oxide and sometimes only to but not through the CdS layer. In any event, it has been found that if the tin oxide layer be considered to be at ground potential, the copper electrode may be at 420 mv., while the zinc electrode may be, in some samples, at 0 mv., and in others at minus 20 mv. The copper and zinc electrodes may be interdigitated and the interdigitations located sufficiently close together that the return paths for current internally of the cell along the tin oxide layer can be short, yet the electrode and lead system can remain simple, and easy to fabricate, requiring no etching through the CdS — $Cu_2S$ sandwich.

The $CuSO_4$ — Cu junction serves to prevent flow of reverse currents through holes which sometimes develop in the CdS layer. Such holes may occur due to defects of the fabricating process, and when they occur the cell is defective because a short circuit path to the $SnO_x$ is then available, and it is the presence of this junction which renders feasible the reduction of cadmium usage by an order of magnitude, in comparison with prior art cells.

SUMMARY

A method of fabricating a photovoltaic cell, including applying a layer of uniformly oriented cadmium sulfide microcrystals on an electrically conductive surface of a substrate, forming a layer of $Cu_2S$ on the cadmium sulfide so applied as to form a heterojunction applying a layer of $CuSO_4$ on the $Cu_2S$ layer and mutually isolated electrodes of Cu and Zn on the $CuSO_4$ heated to form a $Cu$—$CuO_2$ rectifying junction, while the Zn diffuses down through the layers underlying and thereby renders them conductive. The CdS may be or may not be impregnated with zinc. The $Cu$—$CuSO_4$ junction provides oxygen for the rectifying junction, which reduces or largely prevents shorting of the $Cu_2S$ — CdS layer, when the $Cu_2S$ layer or the CdS layer is defective due to the presence of holes in the layers. The CdS and the $Cu_2S$ layers are deposited by successively spraying respectively a cadmium salt-thiourea solution and a copper salt N,N-dimethyl thiourea solution while the glass is floating in molten metal baths of suitable temperatures, allowing CdS micro-crystals and a heterojunction with $Cu_2S$ to develop only on contact of each complex with a suitable heated surface.

DETAILED DESCRIPTION

Figure 1:
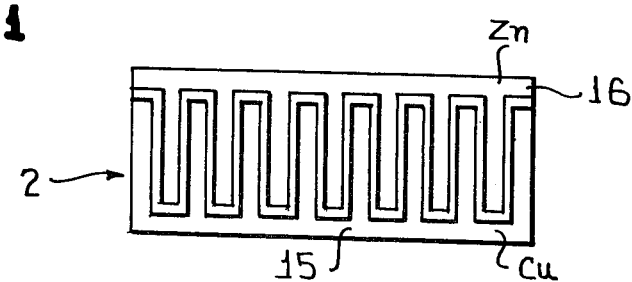
FIG. 1 is a view in plan of a photovoltaic cell according to the invention, showing interdigitated coplanar electrodes.
Figure 2:
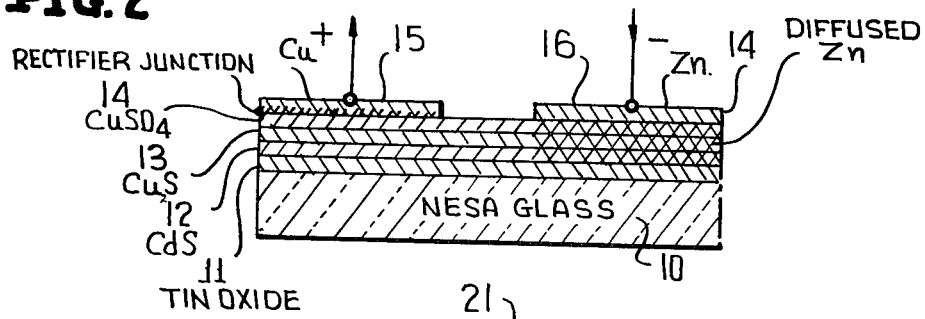
FIG. 2 is a view in section taken on line 2 — 2 of FIG. 1.

In FIG. 1, 10 is a plate of Nesa glass, i.e., non-conductive glass having on one of its surface a thin layer 11 of tin oxide, which is conductive. Overlying the layer 11 of tin oxide is a layer 12 of polycrystalline CdS formed by a novel process according to the present invention. Overlying the layer 12 of CdS is a further layer 13 of $Cu_2S$, also formed by a novel process according to the present invention. Overlying the CdS is a thin layer 14 of $CuSO_4$, on which are deposited positive and negative electrodes 15, 16, of Cu and Zn respectively.

The Cds and $Cu_2S$ layers, at their interface, form a voltage generating heterojunction, the $Cu_2S$ being positive and CdS being negative, when the CdS is illuminated by light of the proper wavelength. Specifically, the cell is responsive to sunlight.

The voltage generated at the heterojunction between the micro-crystalline CdS and the $Cu_2S$ is communicated via the $CuSO_4$ layer to the Cu electrode 15. A reaction occurs between the $CuSO_4$ and the Cu electrode when the latter is heated to 500° F. for about 12 minutes, forming a rectifying like junction R of Cu — $CuO_2$, which is conductive of current out of the cell, so that there is no interference with operation of the cell. The function of the rectifying like junction R will be described hereinafter.

In the prior art it was usual to utilize a tin oxide layer on glass as the ground electrode of a CdS — $Cu_2S$ solar cell. But resistance is high parallel to the surface of the glass through the thin layer of tin oxide, and therefore the efficiency of the cell is low. To reduce losses in the cell, the cell is, according to the prior art, slotted to provide access to the tin oxide at multiple areas thereof, see Carlson. According to the present invention, a zinc electrode 16 is deposited over the $CuSO_4$, but separated from the Cu electrode, supra. When heated, the zinc diffuses down into the underlying layers, down to the tin oxide in some cases, and down to the CdS in other cases. The cell is heated to about 500° F. for about 12 minutes, and it is at this time that the $Cu$ — $CuO_2$ junction is also formed. The Zn diffuses to the tin oxide and thereby a highly conductive path is provided from the tin oxide to the zinc electrode 15, which now becomes the ground or negative electrode of the cell. It is found, in many cells, that the Zn electrode is about 20 mv. below the voltage level of the tin oxide layer 11. This seems to imply that the CdS is active and in conjunction with the Zn forms a negative cell. By interdigitating the Cu and Zn electrodes, 15 and 16, as in FIG. 1, a cell of considerably high efficiency than that taught by Carlson et al is provided, and yet the fabrication is must less costly since the electrodes are co-planar and no etching or machining is required. Efficiency is high because paths through the tin oxide are kept short, a concept broadly suggested in FIG. 4 of Carlson et al. But, according to the present invention, discrete paths to the $SnO_x$ are formed solely by doping, and the doping is provided by the negative electrode material utilized, whereas in Carlson machining or etching is required. The normal voltage of the Cu electrode 15, with respect to the tin oxide layer 11, is about 420 mv. Use of Zn does not degrade this voltage, in any case, and in most cases adds 20 mv. to the available output.

Figure 3:
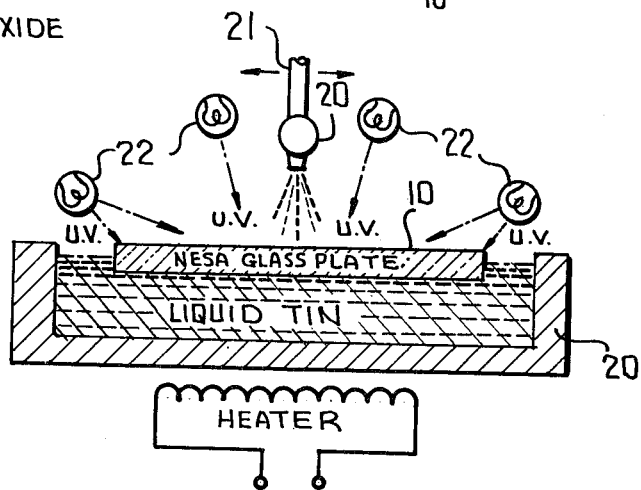
FIG. 3 is a view in section showing the mode of processing a glass plate to form a CdS micro-crystalline layer according to the invention.

The Hill et al patent, supra, teaches that the glass plate which forms a substrate in the present system must be hot, about 700° F., while being sprayed, and that the spraying must be sufficiently slow to permit uniform growth rates for the CdS micro-crystals of the layer. It has been found that any non-uniformities of temperature of the glass plate, producing temperature gradients along the surface of the plate, result in imperfect crystal growth, and therefore a defective cell. To avoid this contingency, the glass plate 10 is sprayed, according to FIG. 3, while the plate 10 is floating in a bath 20 of molten metal, specifically tin. The glass plate 10 is not wet by the tin, so that when the glass plate 10 is removed from the molten tin bath, after it is sprayed, the underside of the plate is clean, or easily cleaned. The spray is provided via an oscillating nozzle 21, which repeatedly re-traces a planar path designed uniformly to cover the plate 10 with spray. The spray is a true water solution of cadmium chloride and thiourea. As the fine droplets of the spray contact the hot surface of the glass plate 10, the water is heated to vaporization and the dissolved material is deposited on the plates forming CdS, plus volatile materials, and the CdS, if it has nucleating areas available, grows as small crystals. The nucleating areas are provided by the tin oxide, and if the spray is sufficiently uniform and sufficiently slow, and if the temperature of the glass surface is adequately high and uniform, crystal growth is uniform and all the crystals have nearly the same spatial inclinations, so that a uniform layer of nearly identical micro-crystals is produced. It has been found that irradiating the crystals, as they grown, with high intensity U.V. light, from sources 22, assists in the crystal growing process and produces a higher yield of near perfect layers than is otherwise the case.

Figure 4:
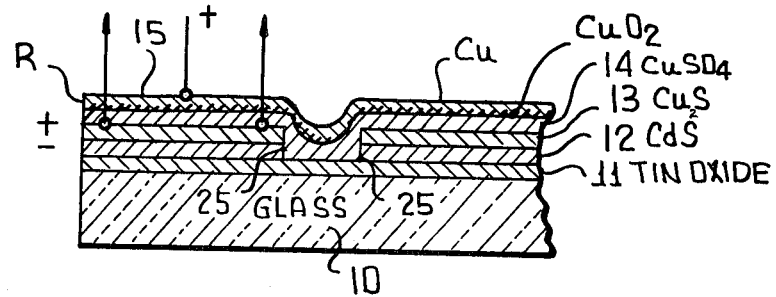
FIG. 4 is a view corresponding generally with FIG. 2, but in which it is assumed that a hole or defect exists in the CdS layer of FIG. 2.

It may happen that a layer of CdS micro-crystals is formed which contains one or more holes, as 25 in FIG. 4. In such case the Cu$_2$S layer, which overlies the CdS, fills the hole, and the voltage generated at the junction between the Cds and the Cu$_2$S, when illuminated by radiation of appropriate wavelength may be shorted or find a low resistance path back to the tin oxide layer. More important, the Cu electrode 15, in its entirety, may be shorted to ground, i.e., to the SnO$_x$ layer, through this path, and therefore an entire cell is usually defective if one pin hole develops anywhere in the CdS layer.

According to the invention, however, a rectifying junction is formed at the underside of the positive copper electrode. This junction does not substantially inhibit flow of current out of the cell via the copper electrode, but it does inhibit flow of current back from the copper electrode to the layer of SnO$_x$, so that presence of a hole in the CdS layer has no effect. In any event, the interposition of the layer of the CuSO$_4$ between the Cu$_2$S and the Cu electrode, and subsequent heat treatment, raises the yield of operative cells in a production run.

The method of forming a CdS layer and a Cu$_2$S layer is summarized as follows. A plate of Nesa glass is floated in a tin bath heated to 800° F., to provide 700° F. at the upper surface of the glass plate. CaCl$_2$·2½H$_2$O of 0.01 molar solution is employed, and an excess of thiourea, in de-ionized water, for the reaction desired. The desired thickness of the CdS microcrystal layer is about 1 or 2 microns.

The Cu$_2$S 18 is developed by floating the glass plate previously coated with polycrystalline CdS, in a bath of molten metal at about 200° F. to 300° F. and spraying with a water solution of 0.0018 molar copper acetate and 0.001 molar of N N dimethyl thiourea, to a thickness of about 1000 A°. The Cu$_2$S is sprayed over the Cu$_2$S layer to a thickness of about 250 A° to 1000 A°, and the Cu and Zn are deposited as interdigitated electrodes. The entire cell is then heated to 500° F. for about 12 minutes causing a Cu — CuO$_2$ layer to form at the copper, and causing the Zn to diffuse.

The copper and zinc electrodes may be radiation heated via separate masks to provide optimum heating in each case for the chemical and/or physical effects desired.

While one specific embodiment has been provided involving a CdS — Cu$_2$S heterojunction, the features of the invention relating to (1) uniformity of heating of the substrate; (2) irradiation by ultraviolet light while the microcrystals are being formed; (3) provision of a rectifying positive terminal formed by interaction with an oxygen-bearing layer underlying the positive terminal; (4) provision of a diffused co-planar negative terminal, are all utilizable with any form of micrycrystalline heterojunction, and are not limited to CdS — Cu$_2$S, or to either of these.

What is claimed is:

1. The method of fabricating a photovoltaic cell of the type having a layer comprised of CdS microcrystals on an electrically conductive surface of a substrate, wherein the improvement comprises the step of forming said layer by a spray process conducted while said electrically conductive surface is maintained at a constant temperature by heating said substrate while spraying said substrate through an oscillating nozzle which repeatedly re-traces a planar path designed to cover said substrate with spray, and at a sufficiently small rate of spray to enable said heating to supply heat to said substrate at a rate sufficient to maintain the temperature of said surface adjacent said planar path essentially constant during the spray process.

2. A method of fabricating a photovoltaic cell on an electrically conductive surface of a substrate comprising:

maintaining said substrate at a constant temperature by heating a portion of said substrate while leaving said electrically conductive surface exposed;

spraying onto said electrically conductive surface a solution of plural compounds which interact on said surface to form a first component microcrystalline layer of a heterojunction;

applying at least one further component layer of said heterojunction over said first component layer;

said spraying being conducted through an oscillating nozzle which repeatedly re-traces a planar path designed to cover said substrate with spray, and at a rate of spray which enables said heating to supply heat to said substrate at a rate sufficient to maintain the temperature of said surface adjacent said planar path essentially constant during the spray process.

3. The method according to claim 2, comprising the further step of applying over said second component layer an electrode comprising a layer of CuSO$_4$ and a layer of copper superposed thereon.

4. The method according to claim 2, comprising the further steps of applying over said second component layer a zinc electrode and heating said zinc electrode for a sufficient time and at a sufficient temperature to effect diffusion of some zinc at least into said second component layer.

5. The method according to claim 2, wherein said substrate is vitreous and said electrically conductive surface is tin oxide.

6. The method according to claim 2, wherein said first component layer is CdS.

7. The method according to claim 6, wherein said further component layer is Cu$_2$S.

8. The method according to claim 7, wherein the method comprises the further step of applying a layer of CuSO$_4$ over said Cu$_2$S layer.

9. A method of fabricating a photovoltaic cell comprising:

heating a portion of a substrate having an electrical conductive surface with a molten material while leaving said conductive surface exposed;

said heating being sufficient to maintain said conductive surface at a temperature of approximately 700° F;

forming a layer of CdS microcrystals by spraying onto said conductive surface a solution comprising a salt of cadmium and a sulphur containing compound;

said spraying being conducted through an oscillating nozzle which repeatedly retraces a planar path designed to cover said surface with spray and at a sufficiently small rate of spray to enable said heating to supply heat to said substrate at a rate sufficient to maintain the temperature of said conductive surface adjacent said planar path essentially constant during the spray process; and, forming a layer of Cu$_2$S over said CdS microcrystals.

10. The method according to claim 9, wherein said sulphur containing compound is thiourea.

11. The method according to claim 9, wherein said salt of cadmium is cadmium chloride.

12. The method of fabricating a photovoltaic cell, comprising the steps of
  forming a layer of CdS microcrystals over an electrically conductive layer on a substrate by a spray process;
  forming a layer of $Cu_2S$ over said layer of CdS to form a photovoltaic heterojunction with said CdS;
  applying Zn over a portion of said layer of $Cu_2S$;
  heating said Zn to about 500° F for a time sufficient to diffuse a portion of said Zn through said layer of $Cu_2S$ and form a low resistance path between said electrically conductive layer and said Zn remaining above said $Cu_2S$.

13. The method of fabricating a photovoltaic cell comprising:
  forming a layer of CdS microcrystals over an electrically conductive layer on a substrate by a spray process;
  forming a layer of $Cu_2S$ over said layer of CdS at such temperature as to form a photovoltaic heterojunction with said CdS;
  coating said layer of $Cu_2S$ with a layer of $CuSO_4$;
  applying Cu and Zn electrodes to said layer of $CuSO_4$, and;
  heating said electrodes to about 500° F for about twelve minutes to diffuse zinc toward said substrate and to improve the voltage characteristics of the cell.

14. The method according to claim 13, wherein said layer of CdS microcrystals is about 1-2 microns thick.

* * * * *

UNITED STATES PATENT AND TRADEMARK OFFICE
CERTIFICATE OF CORRECTION

PATENT NO. : 4,104,420
DATED : August 1, 1978
INVENTOR(S) : John F. Jordan and Curtis M. Lampkin It is certified that error appears in the above-identified patent and that said Letters Patent are hereby corrected as shown below:

Col. 1, l. 54, change "sulphide" to --sulfide--.

Col. 2, l. 22, "$Cu_2S$" omitted after "form".

Col. 2, l. 44, change "CuO" to --$Cu_2O$--.

Col. 3, l. 23, change "$CuO_2$" to --$Cu_2O$--.

Col. 3, l. 41, change "surface" to --surfaces--.

Col. 4, l. 10, change "$CuO_2$" to --$Cu_2O$--.

Col. 4, l. 21, "must" should be --much--.

Col. 4, l. 55, "plates" should be --plate--.

UNITED STATES PATENT AND TRADEMARK OFFICE
CERTIFICATE OF CORRECTION

PATENT NO. : 4,104,420

DATED : August 1, 1978

INVENTOR(S) : John F. Jordan and Curtis M. Lampkin

It is certified that error appears in the above-identified patent and that said Letters Patent are hereby corrected as shown below:

Col. 5, l. 37, "$Cu_2S$" should be --$CuSO_4$--.

Col. 5, l. 41, change "$CuO_2$" to --$Cu_2O$--.

Signed and Sealed this

Third Day of April 1979

[SEAL]

Attest:

RUTH C. MASON
*Attesting Officer*

DONALD W. BANNER
*Commissioner of Patents and Trademarks*